(12) United States Patent
Sugibayashi

(10) Patent No.: US 6,442,742 B1
(45) Date of Patent: Aug. 27, 2002

(54) CACHE MEMORY HAVING A DRAM MEMORY CELL

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/420,693

(22) Filed: Oct. 19, 1999

(30) Foreign Application Priority Data

Oct. 20, 1999 (JP) .......................................... 10-298278

(51) Int. Cl.⁷ .............................................. G06F 17/50
(52) U.S. Cl. ................................. 716/8; 716/9; 716/10
(58) Field of Search ........................ 716/1–18; 708/231, 708/232, 300, 510, 6; 712/1–43

(56) References Cited

U.S. PATENT DOCUMENTS 4,678,889 A * 7/1987 Yamanaka .............. 219/121 IJ
5,822,603 A * 10/1998 Hansen et al. .......... 395/800.01
6,018,488 A * 1/2000 Mishima et al. ......... 365/225.7

* cited by examiner

Primary Examiner—Matthew Smith
Assistant Examiner—Naum Levin
(74) Attorney, Agent, or Firm—Hutchins, Wheeler & Dittmar

(57) ABSTRACT

Semiconductor integrated circuit includes a MPU and a cache memory implemented by a plurality of DRAM macro blocks each disposed between the MPU and bonding pads of the chip. Each DRAM macro block has a redundancy function for replacing a defective row with a redundancy row of memory cells. A plurality of fuse blocks each for storing the row address of the defective row are arranged in a row, with the elongate sides of each of the fuse blocks extending parallel to the signal lines extending between the MPU and the bonding pads. The arrangement allows a large number of signal lines to pass the space between the fuse blocks, thereby allowing a smaller chip size.

6 Claims, 9 Drawing Sheets

US 6,442,742 B1

CACHE MEMORY HAVING A DRAM MEMORY CELL

BACKGROUND OF THE INVENTION (a) Field of the Invention

The present invention relates to a cache memory having a DRAM memory cell and, more particularly, to a semiconductor memory device having therein a micro processing unit and a cache memory having a DRAM memory cell array.

(b) Description of the Related Art

In view of a low operational speed of a main storage device used for a micro processing unit (MPU) in a computer system, it is usual that the MPU is associated with a cache memory having a higher operational speed. The cache memory temporarily stores some of data for the MPU to compensate the low speed of the main storage device.

In general, the cache memories, required to have a higher operational speed, have been implemented by static random access memories (SRAMs), which generally have a larger circuit scale however. Thus, a small-capacity SRAM is generally used heretofore for the cache memory.

It is desirable that a dynamic random access memory (DRAM) having a larger storage capacity be used as the cache memory for reducing the chip size of the LSI. If the cache memory is to be implemented by a DRAM, a configuration may be employed in that the MPU and bonding pads are disposed in the central area and the peripheral area, respectively, of a semiconductor chip, with the DRAM cache memory disposed between the MPU and the bonding pads. If the DRAM has a redundancy function wherein a defective row of memory cells are replaced by a redundancy row of memory cells, a large number of redundancy fuses are disposed in the DRAM for informing the defective row to effect the redundancy function.

If the configuration as described above is employed in the semiconductor integrated circuit, the large number of redundancy fuses are inevitably disposed between the MPU and the bonding pads. This may cause complicated routes for the signal lines or interconnects connecting the MPU with the bonding pads due to the interference between the signal lines and the redundancy fuses. Thus, it is desired to design a semiconductor integrated circuit having a MPU and a cache memory implemented by a DRAM to have a simple structure for the arrangement of the signal lines.

SUMMARY OF THE INVENTION

In view of the above, it is an object of the present invention to provide a semiconductor integrated circuit including a MPU and a cache memory and having a simple structure for the arrangement of the signal lines.

The present invention provides a semiconductor integrated circuit including a microprocessor unit (MPU), a cache memory for temporary storing data for the MPU, and a plurality of signal lines for connecting the MPU with bonding pads, the cache memory including at least one DRAM block disposed between the MPU and the bonding pads, the DRAM block having a plurality of rectangular fuse blocks each including a plurality of elongate redundancy fuses for storing data for a redundancy function of the DRAM block, the rectangular fuse blocks having a pair of elongate sides extending substantially parallel to the signal lines.

In accordance with the semiconductor integrated circuit of the present invention, the configuration of the fuse blocks provides a larger space for the signal lines, thereby reducing overall chip size of the semiconductor integrated circuit.

The above and other objects, features and advantages of the present invention will be more apparent from the following description, referring to the accompanying drawings.

PREFERRED EMBODIMENTS OF THE INVENTION

Figure 1:
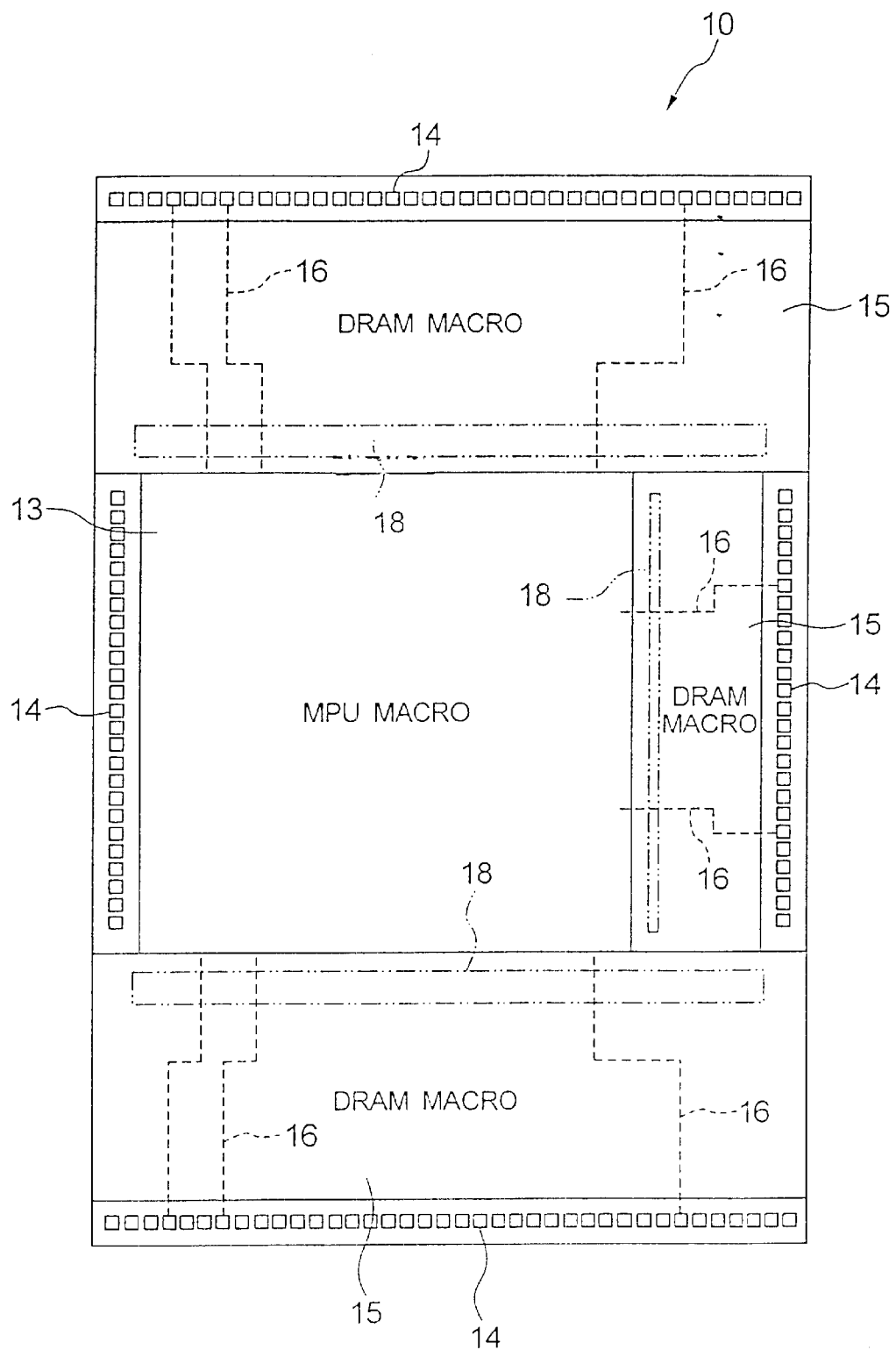
FIG. 1 is a top plan view of a semiconductor integrated circuit including a MPU and a DRAM cache memory according to a first embodiment of the present invention.

Now, the present invention is more specifically described with reference to accompanying drawings, wherein similar constituent elements are designated by similar reference numerals.

Referring to FIG. 1, a semiconductor integrated circuit, generally designated by numeral 10, according to a first embodiment of the present invention includes a MPU macro block 13 disposed in the central area of the semiconductor chip, a cache memory including three DRAM macro blocks 15 disposed for encircling the MPU macro block 13 except for one side of the MPU macro blocks 13, and a plurality of bonding pads 14 disposed in the peripheral area of the semiconductor chip.

The three DRAM macro blocks 15 implementing a cache memory includes a pair of data DRAM macro blocks opposing to each other with the MPU macro block 13 disposed therebetween and a single TAG DRAM macro block disposed adjacent to one of the sides of the MPU macro block 13. Each of the DRAM macro blocks 15 has a redundancy function wherein a defective row including at least one defective memory cell is replaced by a redundant row of memory cells. The number of the bonding pads 14 in the bonding pad blocks is, for example, 600 in total. In the drawing, any constituent element is not depicted to any scale.

In the semiconductor integrated circuit of FIG. 1, since the DRAM macro blocks 15 are disposed between the MPU macro block 13 and the bonding pads 14, most of the signal lines 16 (including power source lines) for coupling the input/output terminals of the MPU macro block 13 and the bonding pads 14 pass the areas for the cache memory, which may interfere the arrangement of the signal lines 16 especially at the fuse blocks 18 used for the redundancy function.

Figure 2:
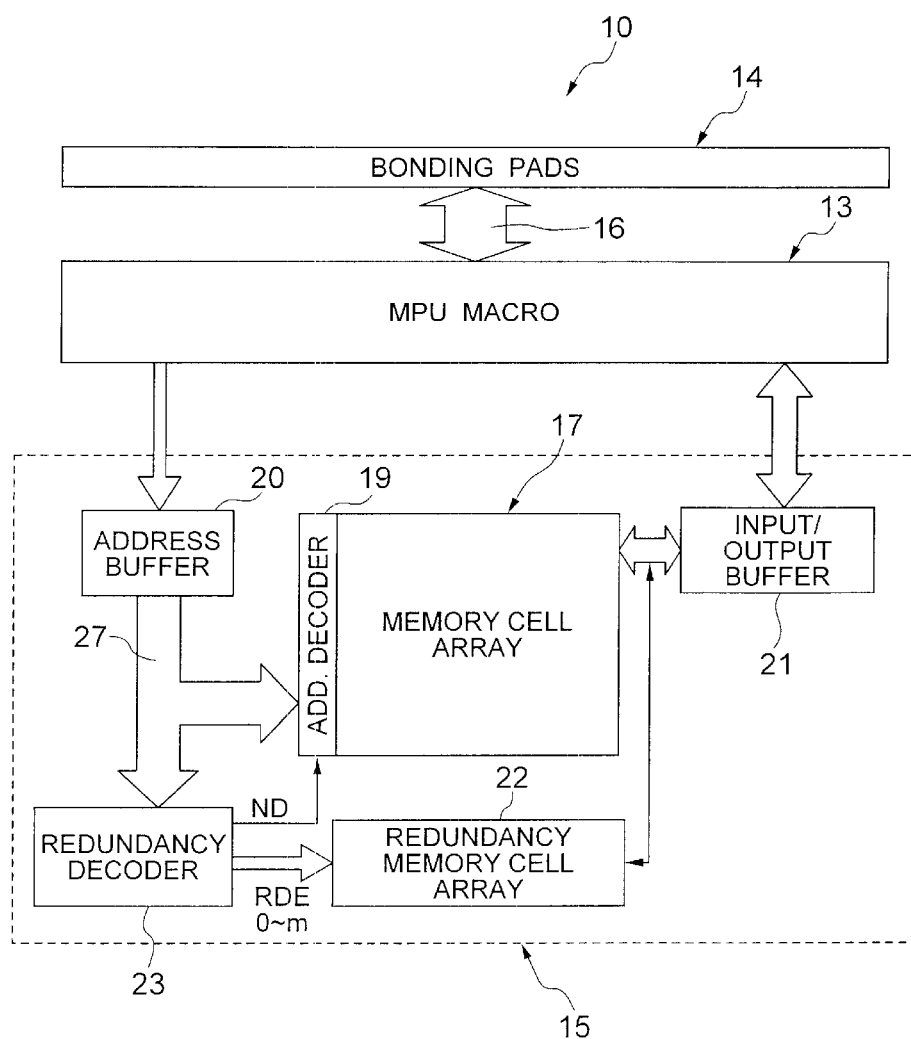
FIG. 2 is a block diagram of the semiconductor integrated circuit of FIG. 1.

Referring to FIG. 2 showing the block diagram of the semiconductor integrated circuit of FIG. 1, the MPU macro block 13, one of the three DRAM macro blocks 15 and the bonding pads 14 are depicted in the figure. The DRAM macro block 15 includes an address buffer 20 for receiving an input address from the MPU macro block 13, an address decoder 19 for decoding the input address from the MPU macro blocks 13, a memory cell array 17 including a plurality of memory cells to be specified by the address decoded by the address decoder 19, a data buffer 21 for inputting or outputting data to/from the memory cell array 17. The DRAM macro cell 15 also includes a redundancy memory cell array 22 including a plurality of rows of redundancy memory cells, and a redundancy decoder 23 for storing the defective row address and comparing the defective row address against an input row address to operate the DRAM macro block 15 for a redundancy function.

The MPU 13 delivers an address signal to the address buffer 20, and delivers/receives data to/from the data buffer 21. The address buffer 20 delivers the address signal 27 to the address decoder 19 and the redundancy decoder 23. The memory cell array 17 includes a plurality of word lines (not shown), a plurality of bit line pairs (not shown), and a plurality of DRAM memory cells (not shown) disposed at intersections between one of the word lines and one of the bit line pairs. The DRAM macro block 15 also includes a sense amplifier for sensing the data stored in the memory cell and restores the data into the memory cell.

Figure 3:
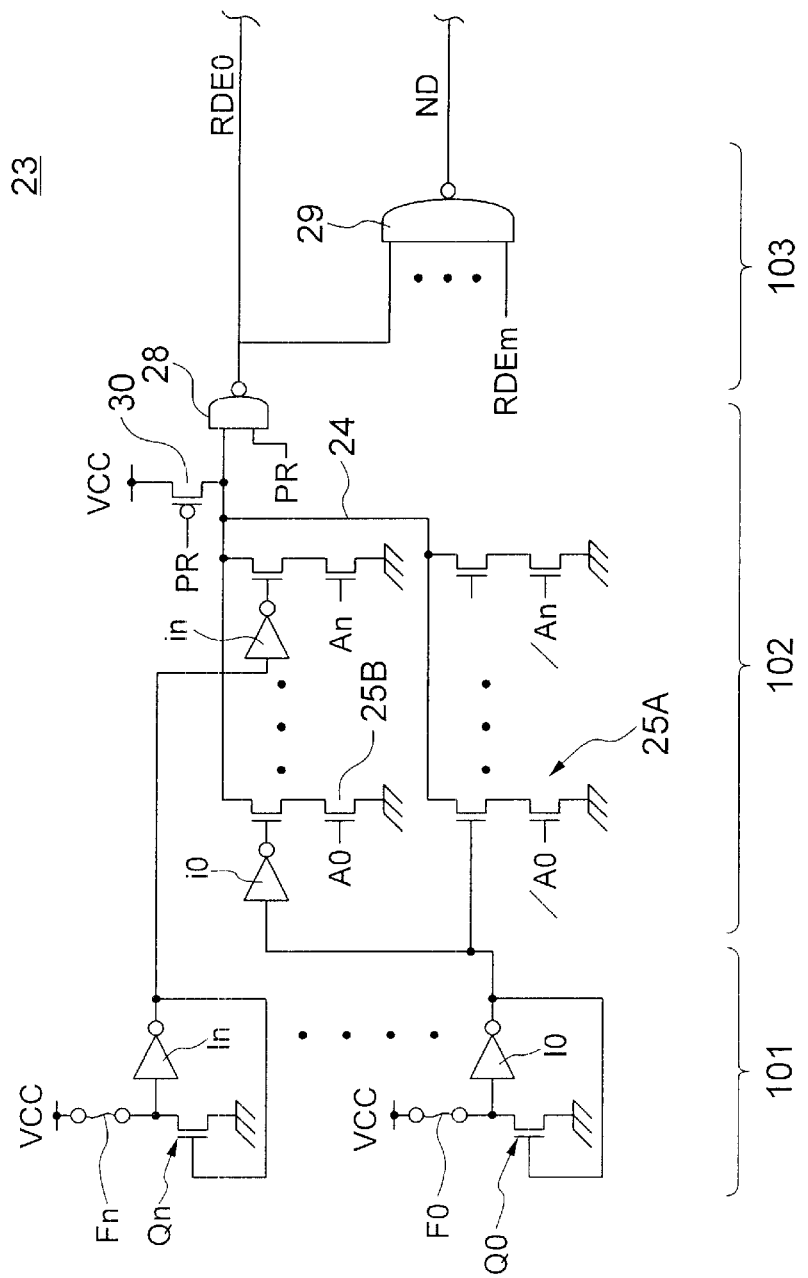
FIG. 3 is a circuit diagram of the redundancy decoder in the DRAM shown in FIG. 2.

Referring to FIG. 3, there is shown the configuration of a portion of the redundancy decoder 23 shown in FIG. 2. The redundancy decoder 23 has a function for comparing an input row address supplied from the MPU macro block 13 against the defective row address stored in the redundancy decoder 23, to deliver a coincidence signal upon detecting coincidence between the input row address and the defective row address.

More specifically, the redundancy decoder 23 includes a plurality of fuse sections 101, one of which is shown in the figure, a plurality of coincidence detectors 102, one of which is shown in the figure, each corresponding to one of the fuse sections 101 and outputting a low level for a coincidence signal, such as RDEO, upon coincidence of the input row address with the corresponding defective row address, and an output section 103 disposed for the plurality of coincidence detectors 102 to output a redundancy active signal ND. The fuse sections 101 and the coincidence detectors 102 are provided in number corresponding to the number of the redundancy rows of the memory cells provided in the DRAM macro block.

Each fuse section 101 has a fuse block including a plurality of fuses F0 to Fn corresponding to the number of bits for a row of memory cells in the memory cell array. The fuses F0 to Fn of the fuse block are cut or not cut depending on the n-bits of the address for the defective row based on the test result. Each fuse section 101 further includes an n-channel transistor Q0, . . . , Qn connected in series with a corresponding one of the fuses F0 to Fn between the source line VCC and the ground line, and an inverter I0, . . . , In having an input connected to the node connecting a corresponding one of the fuses F0 to Fn and the associated transistor Q0, , Qn and an output connected to the gate of the corresponding n-channel transistor Q0, . . . , Qn for a feed-back loop.

The fuse section 101 stores the defective row address and delivers high levels and low levels corresponding to "1" or "0" of the n bits of the defective row address depending on the "cut" or "non-cut" of the redundancy fuses.

The coincidence detector 102 includes a detecting line 24, a plurality of first branches 25A (depicted at the bottom side of the coincidence detector 102) each connected between the detecting line 24 and the ground for detecting coincidence of one of the bits of the defective row address with a corresponding bit of the input row address when the bit of the defective row address is "1", and a plurality of second branches 25B (depicted at the top side of the coincidence detector 102) each connected between the detecting line 24 and the ground line for detecting coincidence of one of the bits of the defective row address with a corresponding bit of the input address when the bit of the defective row address is "0".

Each first branch 25A has a first n-channel transistor receiving one of the bits of the defective row address at the gate thereof and a second n-channel transistor receiving a reverse bit (/A0, . . . , /An) of the input row address at the gate thereof. Each second branch 25B has a second n-channel transistor receiving one of the reverse bits of the defective row address at the gate thereof and a second n-channel transistor receiving a bit (A0 to An) of the address row signal at the gate thereof.

In operation of the coincidence detector 102, the detecting line is first pre-charged to a high level by a pre-charge transistor 30. If the input row address including n bits A0 to An coincides with the defective row address stored in and supplied from the fuse sections 101, the detecting line 24 remains at the high level, which is output from a NAND gate 28 as a low level for the coincidence signal such as RDE0. On the other hand, if the input row address does not coincide with the defective row address, the detecting line 24 is lowered to a low level, which is output from the NAND gate 28 as a high level for the coincidence signal such as RDE0. If the input row address coincides with any one of a plurality of the defective row addresses stored in the fuse sections 101, a NAND gate 29 in the output section 103 delivers a redundancy active signal ND to indicate the DRAM macro block 15 to operate for a redundancy function.

Figure 4:
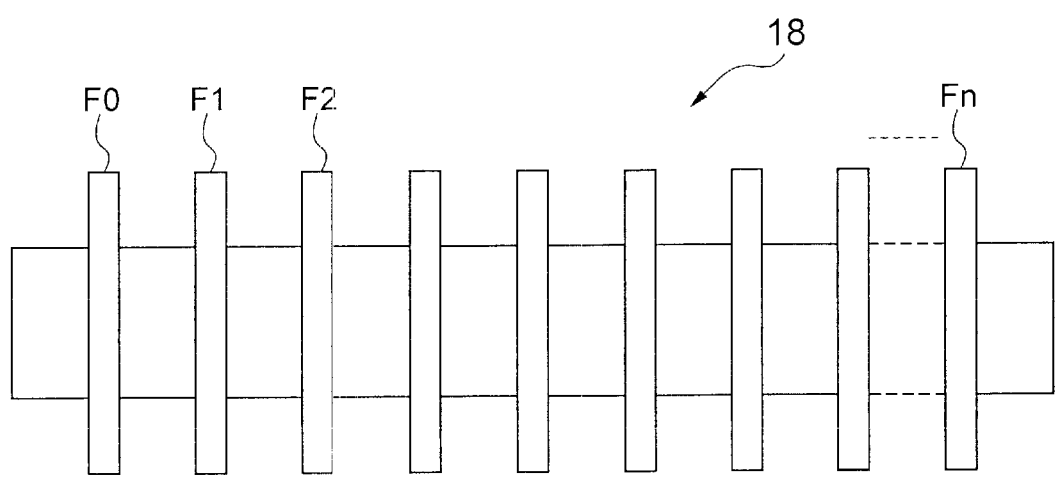
FIG. 4 is a schematic top plan view of the fuse block shown in FIG. 3.

Referring to FIG. 4 showing the fuse block 18 in the fuse section 101, a plurality of elongate fuses F0 to Fn are arranged in the direction normal to the extending direction of each elongate fuse to form the fuse block 18 having an elongate side normal to the extending direction of each fuse. The fuses F0 to Fn of the fuse block 18 are implemented by a third layer metal (aluminum) out of four metallic interconnect layers, with the fourth layer metal implementing signal lines 16 shown in FIG. 1.

Figure 5:
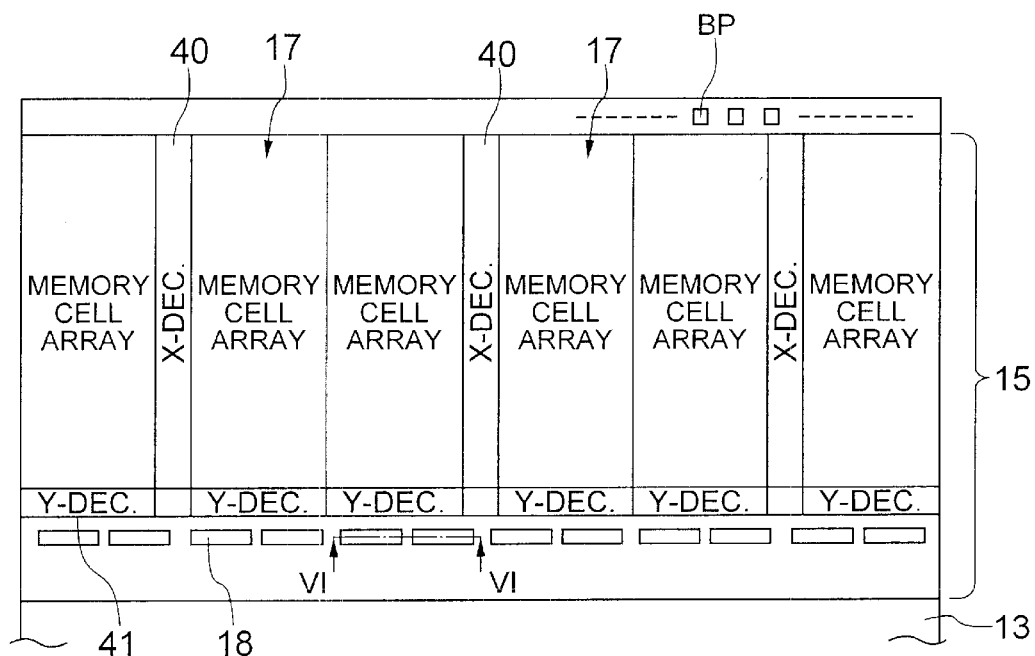
FIG. 5 is a top plan view of a DRAM macro block of a comparative example for comparing therewith the DRAM macro block according to the embodiment of the present invention.

Referring to FIG. 5 showing a comparative example of one of the DRAM macro blocks 15 to be compared against the configuration of the present embodiment, a plurality of memory cell arrays 17 are juxtaposed to one another, with a row address decoder (X-decoder) 40 and a column address decoder (Y-decoder) 41 disposed for each or each two of the memory cell arrays 17. A plurality of fuse blocks 18 are disposed for a redundancy function of the DRAM macro block 15 in a row and in the vicinity of the outer periphery of the DRAM macro block 15. The number of fuse blocks 18 coincides with the number of redundancy rows of the memory cells provided in the DRAM macro block 15.

In general, the cut-out of the redundancy fuses by using laser light generates physical impacts in the vicinity of the fuses, e.g., an area within about 6 μm from the fuses. Thus, it is considered that another constituent element should not be disposed in this area.

Figure 6:
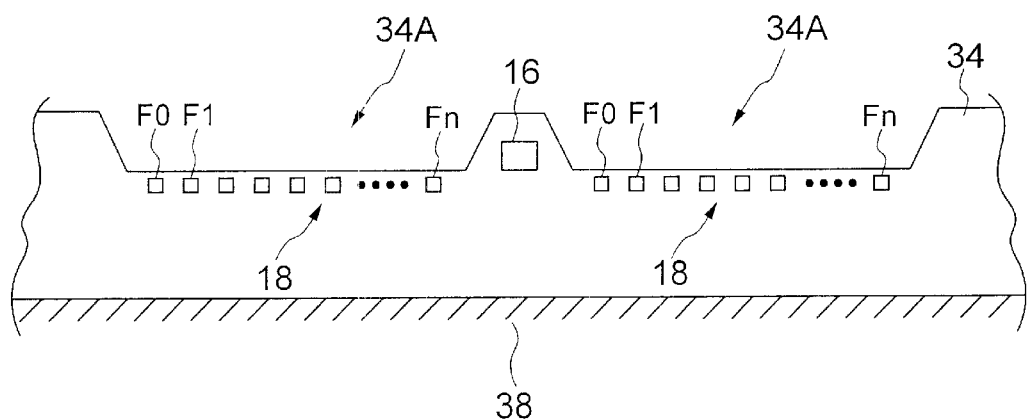
FIG. 6 is a sectional view taken along line VI—VI in FIG. 5.

Referring additionally to FIG. 6 showing a cross-section taken along line VI—VI in FIG. 5, the redundancy fuses of the fuse blocks 18 are implemented by a third layer metal, with the area for signal line 16 connecting the bonding pad with the terminal of the MPU macro blocks 13 being interposed between the fuse blocks 18. The signal line 16 is implemented by a fourth layer metal. Other signal lines 16 should be disposed in other areas other than the area for the fuse blocks 18. The top portion of the insulator layer 34 covering the redundancy fuses is subjected to etch-back to form a rectangular depression 34A having an elongate side extending in the direction parallel to the extending direction of the fuse block. The elongate side of the depression 34A is somewhat larger than the elongate side of the fuse blocks 18 and narrows the space for the signal line 16. This configuration is not suitable for the arrangement of the fuse blocks 18 and the signal lines 16.

Figure 7:
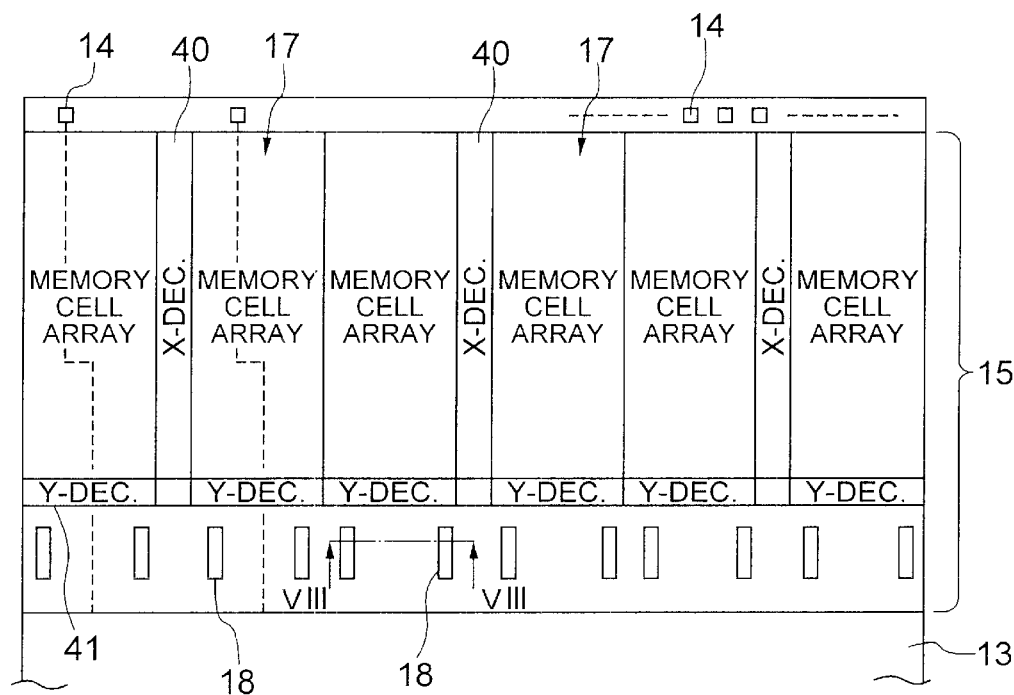
FIG. 7 is a top plan view of the DRAM macro block shown in FIG. 1 having fuse blocks therein.

Referring to FIG. 7 showing, similarly to FIG. 5, an arrangement of one of the DRAM macro blocks 15 in a semiconductor integrated circuit according to an embodiment of the present invention, the fuse blocks 18 are arranged so that the elongate sides thereof extend parallel to the signal lines 16. This provides a larger space for the signal lines 16 compared to the comparative example of FIG. 5.

Figure 8:
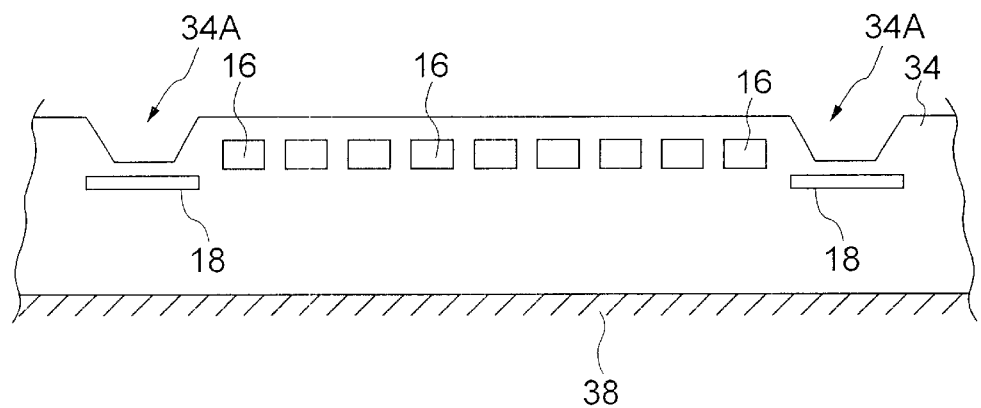
FIG. 8 is a sectional view taken along line VIII—VIII in FIG. 7.

Referring additionally to FIG. 8 showing a cross-section taken along line VIII—VIII in FIG. 7, the narrow side of the substantially rectangular depression 34A is smaller than the narrow side of the fuse blocks 18 which is substantially equal to the length of each redundancy fuse. The configuration wherein the rectangular depression 34A has an I elongate side substantially parallel to the extending direction of the signal lines 16 and a narrow side which is smaller than the narrow side of the fuse block 18 provides a larger space for the signal lines 16 extending in the space between the fuse blocks 18. Although the arrangement of FIG. 7 involves a somewhat larger side of the DRAM macro block 15 compared to the DRAM macro block of FIG. 5, the configuration of the DRAM macro block 15 of FIG. 7 significantly reduces the overall chip size of the semiconductor integrated circuit by assuring the space for the signal lines 16.

Figure 9:
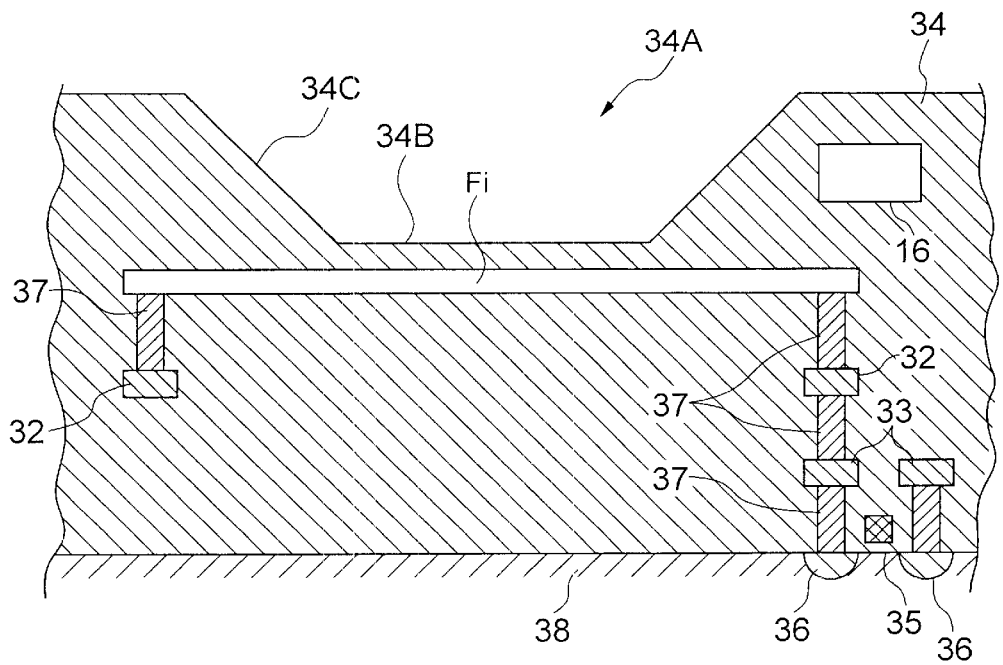
FIG. 9 is an enlarged partial sectional view of FIG. 8.
Figure 10:
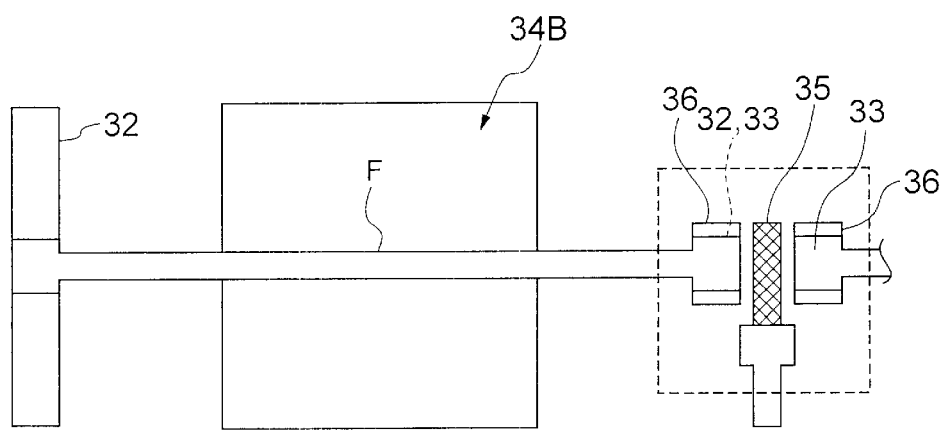
FIG. 10 is a top plan view for showing the portion of the fuse blocks shown in FIG. 9.

Referring to FIGS. 9 and 10, there is shown the detail of one of the fuse blocks in FIG. 8 in cross-section and a top plan view, respectively. The semiconductor integrated circuit includes a semiconductor substrate 38 including source/drain regions 35 and 36, above which a gate electrode 35, first aluminum layer 33, second aluminum layer 32, third aluminum layer implementing the redundancy fuses F0 to Fn and fourth aluminum layer implementing the signal lines 16 are formed. Via plugs 37 are formed to connect the respective aluminum layers 33, 32 and fuses. The portion of the insulator layer 34 disposed above the redundancy fuses F0 to Fn is subjected to a selective etching to have a small thickness portion 34B, a tapered portion 34C and a top portion thereof. The small thickness portion 34B is used for radiation by laser, the tapered portion 34C functions for limiting the radiation area for semiconductor integrated circuit. The signal lines 16 implemented by the fourth layer metal are disposed outside the small thickness portion 34B and the tapered portion 34C for avoiding laser radiation.

Figure 11:
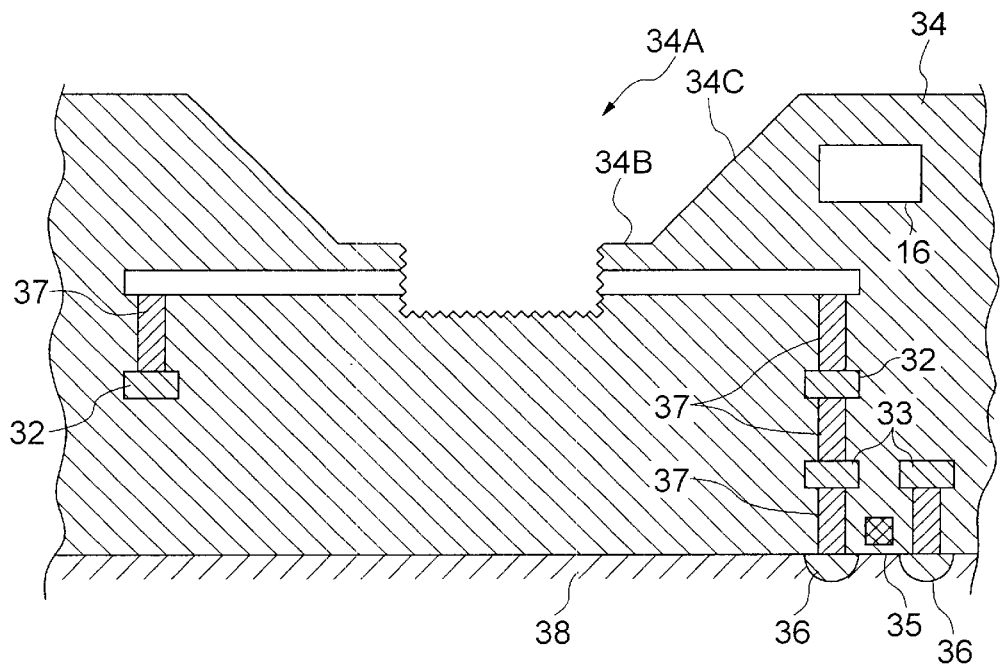
FIG. 11 is another enlarged sectional view of FIG. 8 for showing a cut-out state of a fuse.

Referring to FIG. 11 depicting the redundancy fuse shown in FIG. 9 after the redundancy fuses in a fuse block are selectively cut by the laser radiation. The cut-outs of the redundancy fuses are detected by the fuse section 101 as detailed with reference to FIG. 3 to store a defective row address including at least one defective memory cell, and also makes one of the redundancy word lines to be active for replacement of the defective row by the redundancy row.

Figure 12:
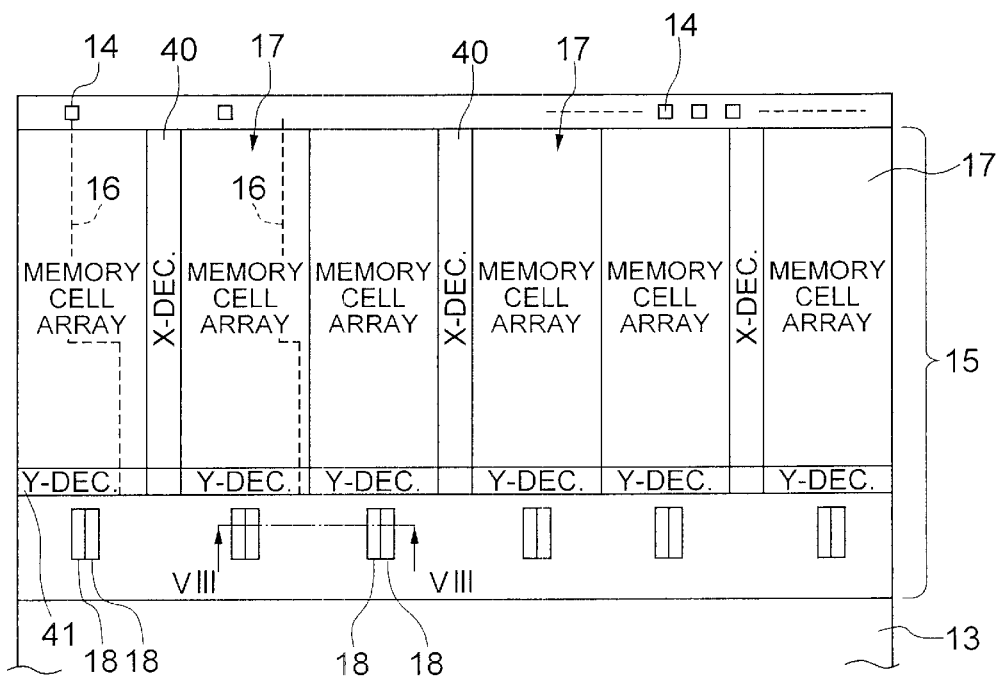
FIG. 12 is a top plan view of a semiconductor integrated circuit including a MPU and a DRAM cache memory according to a second embodiment of the present invention.

Referring to FIG. 12, a DRAM macro block of a semiconductor integrated circuit according to a second embodiment is similar to the DRAM macro block in the first embodiment, except for a pair of fuse blocks being disposed adjacent to each other for a single memory cell array.

Figure 13:
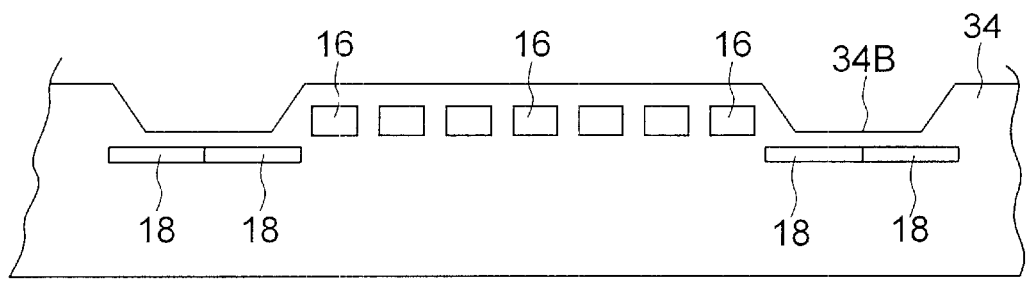
FIG. 13 is a sectional view of the semiconductor integrated circuit taken along line XIII—XIII in FIG. 12.
Figure 14:
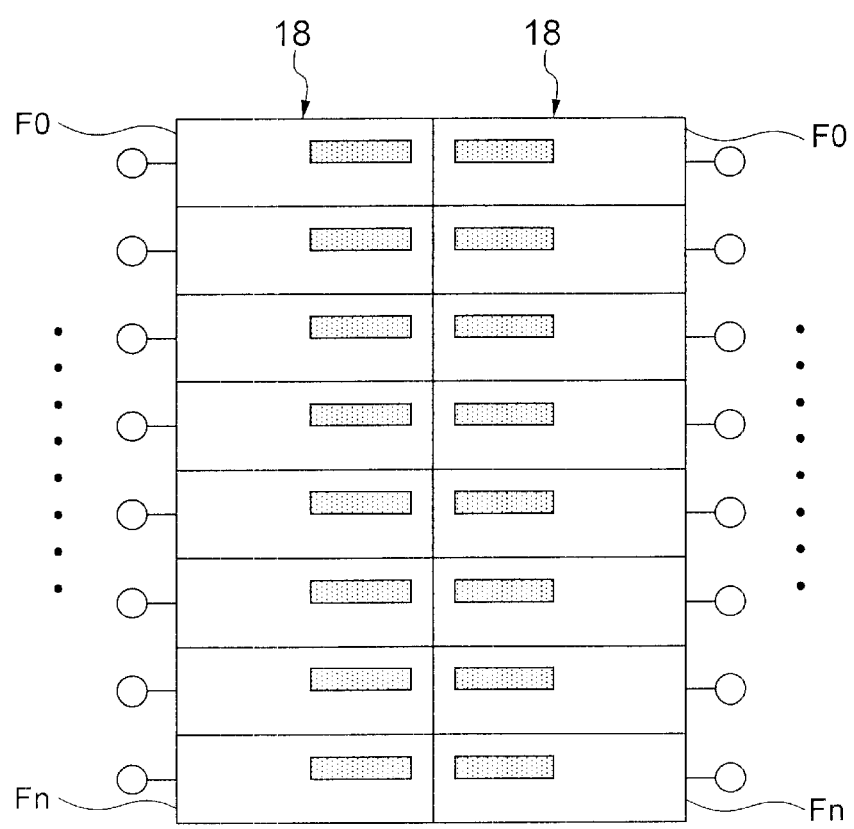
FIG. 14 is an enlarged partial top plan view for showing a portion of FIG. 12.

Referring additionally to FIGS. 13 and 14 showing a cross-section taken along line XIII—XIII in FIG. 12 and a top plan view of the pair of fuse blocks, the space for signal lines 16 is disposed between the pairs of fuse blocks 18. The pairs of fuse blocks 18 are disposed so that the gap therebetween is substantially zero. The small thickness portion 34B of the insulator layer 34 disposed above the pair of fuse blocks 18 has a length smaller than double the narrow side of the fuse block 18. The ends of the redundancy fuses of one of the pair of fuse blocks 18 are connected to the ground line together with the ends of the redundancy fuses of the other of the pair of fuse blocks 18.

The configuration of the second embodiment may provide a larger space for the signal lines compared to the first embodiment.

Since the above embodiments are described only for examples, the present invention is not limited to the above embodiments and various modifications or alterations can be easily made therefrom by those skilled in the art without departing from the scope of the present invention.

What is claimed is:

1. A semiconductor integrated circuit comprising a microprocessor unit (MPU), a cache memory for temporary storing data for said MPU, and a plurality of signal lines for connecting said MPU with bonding pads, said cache memory including at least one DRAM block disposed between said MPU and said bonding pads, said DRAM block having a plurality of rectangular fuse blocks each including a plurality of elongate redundancy fuses for storing data for a redundancy function of said DRAM block, said rectangular fuse blocks having a pair of elongate sides extending substantially parallel to said signal lines, whereby said signal lines extend in spaces formed between said elongated sides of said fuse blocks.

2. The semiconductor integrated circuit as defined in claim 1, wherein each of said elongate fuse blocks has a pair of narrow sides extending in alignment with a pair of narrow sides of another of said elongate fuse blocks.

3. The semiconductor integrated circuit as defined in claim 1, wherein a pair of said elongate fuse blocks are arranged at a specified pitch from another pair of said elongate fuse bocks, and said signal lines pass a gap between said pair of elongate fuse blocks and said another pair of elongate fuse blocks.

4. The semiconductor integrated circuit as defined in claim 3, wherein each of pair of said elongate fuse blocks has a pair of narrow sides extending in alignment with a pair of narrow sides of said another pair of said elongate fuse blocks.

5. The semiconductor integrated circuit as defined in claim 1, wherein said elongate redundancy fuses are implemented by a (n−1)th layer metal and said signal lines are implemented by n-th layer metal.

6. The semiconductor integrated circuit as defined in claim 1, wherein said elongate redundancy fuses of one of said fuse blocks represent a defective row address depending on a cut or non-cut state of each of said elongate redundancy fuses.

* * * * *